United States Patent
Kim et al.

(10) Patent No.: US 11,418,215 B2
(45) Date of Patent: Aug. 16, 2022

(54) ELECTRONIC DEVICE AND METHOD OF OPERATING THE SAME

(71) Applicant: SK hynix Inc., Icheon-si (KR)

(72) Inventors: Dae Sung Kim, Icheon-si (KR); Soon Young Kang, Icheon-si (KR); Jang Seob Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 194 days.

(21) Appl. No.: 16/923,748

(22) Filed: Jul. 8, 2020

(65) Prior Publication Data
US 2021/0211141 A1 Jul. 8, 2021

(30) Foreign Application Priority Data
Jan. 8, 2020 (KR) .................. 10-2020-0002705

(51) Int. Cl.
*H03M 13/11* (2006.01)
*H03M 13/37* (2006.01)
*G06N 3/08* (2006.01)
*G06N 5/04* (2006.01)
*G06F 17/18* (2006.01)
*G06F 7/544* (2006.01)

(52) U.S. Cl.
CPC ....... *H03M 13/1108* (2013.01); *G06F 7/5443* (2013.01); *G06F 17/18* (2013.01); *G06N 3/084* (2013.01); *G06N 5/046* (2013.01); *H03M 13/37* (2013.01)

(58) Field of Classification Search
CPC . H03M 13/1108; H03M 13/37; G06F 7/5443; G06F 17/18; G06N 3/084; G06N 5/046
See application file for complete search history.

(56) References Cited

U.S. PATENT DOCUMENTS

2012/0290901 A1* 11/2012 Kong .................. G06F 11/1048
714/781
2021/0135688 A1* 5/2021 Zamir ............... H03M 13/3723

OTHER PUBLICATIONS

Amir Bennatan, etc., "Deep Learning for Decoding of Linear Codes—A Syndrome-Based Approach", 2018 IEEE International Symposium on Information Theory (ISIT), Feb. 13, 2018.
Loren Peter Lugosch, "Learning algorithms for error correction", McGill University Libraries, Apr. 2018.

* cited by examiner

*Primary Examiner* — Kyle Vallecillo
(74) *Attorney, Agent, or Firm* — Perkins Coie LLP

(57) ABSTRACT

The present technology includes an electronic device and a method of operating the same using an artificial neural network. The electronic device according to the present technology includes a decoding controller inputting a primary syndrome vector generated based on a read vector and a parity check matrix to a trained artificial neural, and selecting any one of a first error correction decoding algorithm and a second error correction decoding algorithm based on an output of the trained artificial neural network corresponding to the input, and an error correction decoder performing error correction decoding on a read vector using the selected error correction decoding algorithm. The output of the trained artificial neural network includes a first predicted value indicating a probability that a first error correction decoding using the first error correction decoding algorithm is successful.

20 Claims, 15 Drawing Sheets

FIG. 9

$$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

ELECTRONIC DEVICE AND METHOD OF OPERATING THE SAME

CROSS-REFERENCE TO RELATED APPLICATION

This patent document claims priority to and benefits of the Korean patent application number 10-2020-0002705, filed on Jan. 8, 2020, which is incorporated herein by reference in its entirety.

TECHNICAL FIELD

The disclosed technology relates to an electronic device and a method of operating the same, and more particularly, to an electronic device using an artificial neural network and a method of operating the same.

BACKGROUND

An electronic device may include a storage medium that temporarily or permanently stores data. During various operations such as writing, reading, transmission or processing, data error or data corruption may occur.

In order to ensure reliability of data, the electronic device may use error correction techniques such as error correction encoding and error correction decoding.

SUMMARY

Embodiments of the disclosed technology provide an electronic device and a method of operating the same using an artificial neural network for performing an effective error correction decoding.

Embodiments of the disclosed technology provide an electronic device and a method of operating the same capable of retraining an artificial neural network using a result of error correction decoding.

In one aspect, an electronic device is provided to include a decoding controller inputting a primary syndrome vector generated based on a read vector and a parity check matrix to a trained artificial neural network, and selecting any one of a first error correction decoding algorithm and a second error correction decoding algorithm based on an output of the trained artificial neural network corresponding to the input, and an error correction decoder performing an error correction decoding on a read vector using the selected error correction decoding algorithm. The output of the trained artificial neural network includes a first predicted value indicating a probability that a first error correction decoding using the first error correction decoding algorithm is successful.

In another aspect, a method of operating an electronic device is provided. The method includes generating a primary syndrome vector based on a read vector and a parity check matrix, inputting the generated primary syndrome vector to a trained artificial neural network, selecting an error correction decoding algorithm that is either a first error correction decoding algorithm or a second error correction decoding algorithm based on an output of the trained artificial neural network corresponding to the input, and performing an error correction decoding on the read vector using the selected error correction decoding algorithm. The output of the trained artificial neural network includes a first predicted value indicating a probability that a first error correction decoding using the first error correction decoding algorithm is successful.

According to implementations of the disclosed technology, since the selection of the error correction decoding algorithm can be efficiently performed, a throughput of the electronic device can be improved, and power consumption can be reduced.

BRIEF DESCRIPTION OF THE DRAWINGS

FIG. 9 is an exemplary diagram for describing a parity check matrix.

DETAILED DESCRIPTION

Figure 1:
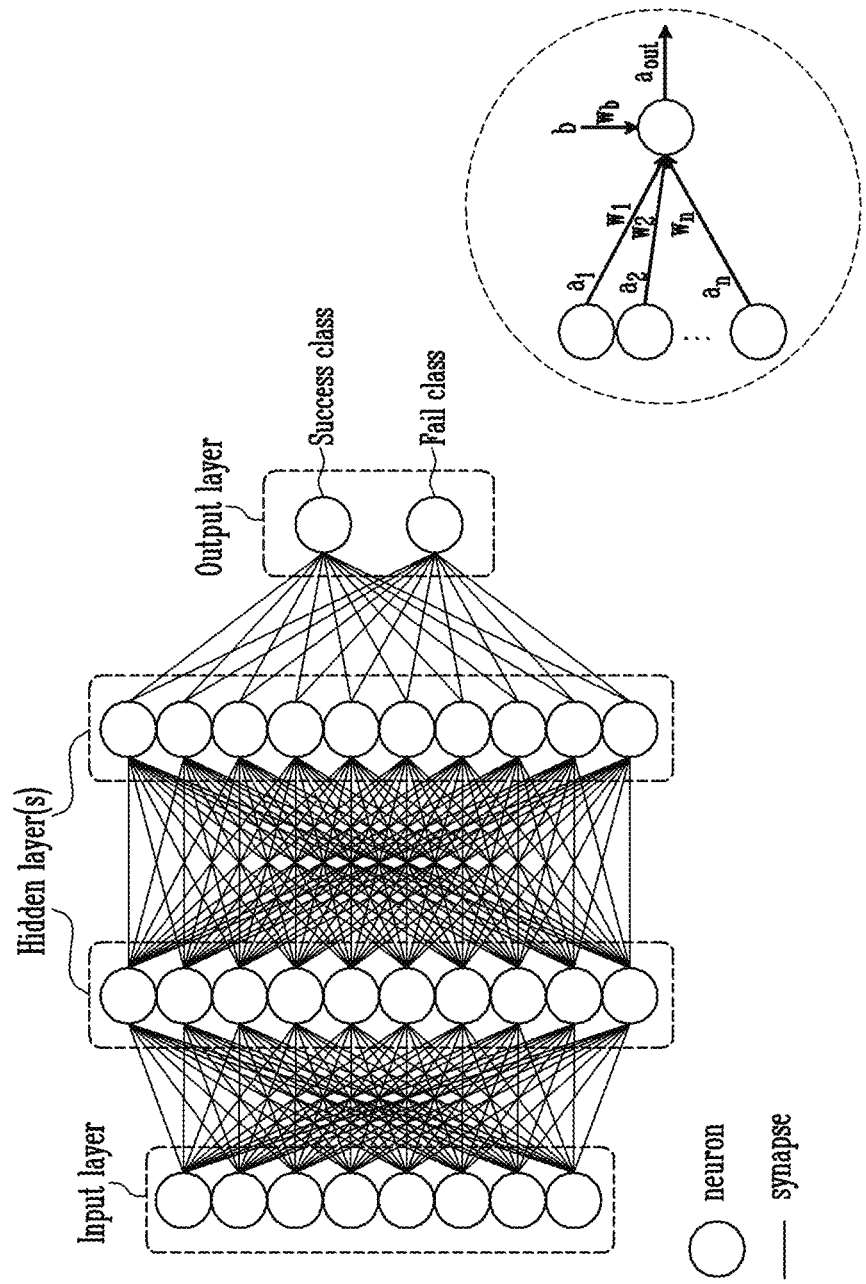
FIG. 1 is an exemplary diagram for describing an artificial neural network.

FIG. 1 is an exemplary diagram for describing an artificial neural network.

The artificial neural network may include an input layer, at least one hidden layer, and an output layer. Each of the input layer, the hidden layer, and the output layer may include a plurality of signal processing elements or nodes effectuating artificial neurons or neurons. A neuron present in the input layer may be referred to as an input neuron, a neuron present in the one or more hidden layers may be referred to as the hidden neuron, and a neuron present in the output layer may be referred to as an output neuron. Certain signal processing elements or nodes are connected via connecting junctions as artificial synapses. Each connecting junction connecting two nodes or neurons (e.g., two nodes in different adjacent layers) can be structured to receive and process a signal from a first signal processing element or neuron to produce a junction signal that is received by a second signal processing element or neuron. As shown in FIG. 1, connecting junctions or synapses provide connections between signal processing elements or neurons in different layers such as adjacent layers, such as neurons of the input layer and neurons of the first hidden layer, neurons of different hidden layers and neurons of the last hidden layer and the neurons of the output layer. As illustrated in FIG. 1, one neuron on a layer may be connected by synapses to different neurons in another adjacent layer and, in various implementations, the output of one neuron may be weighted differently by synapses to other neurons in an adjacent layer.

The artificial neural network may be trained according to a supervised learning method or an unsupervised learning method.

When the supervised learning method is used during training, labeled training data may be input to the artificial neural network. For example, training data labeled as a success class and training data labeled as a fail class may be input to the artificial neural network.

At least one forward propagation and at least one back propagation may be performed on the artificial neural network while the training is performed.

For example, during the forward propagation, each of the neurons may calculate output value $a_{out}$ according to an activation function. For example, the output value $a_{out}$ may be calculated according to Equation 1.

$$a_{out} = g(z), \text{ where } z = bw_b + \sum_{i=1}^{N} a_i w_i \quad \text{[Equation 1]}$$

where g(z) represents the activation function of the neuron, b represents a bias value of the neuron, $w_b$ represents a bias weight value of the neuron, $a_i$ represents an output value received from an i-th (i is a natural number) among neurons included in a previous layer, and $w_i$ represents a weight value of a synapse connected to the i-th neuron among the neurons included in the previous layer. According to an embodiment, the bias value b and the bias weight value $w_b$ may not be used when calculating the output value $a_{out}$.

When the forward propagation is performed up to the output neurons, the back propagation may be performed to reduce an error value between a predicted vector (output values calculated by the output neurons) and a target vector. During the back propagation, model parameters, for example, the bias weight value $w_b$ of each of the neurons and the weight values $w_1, w_2, \ldots,$ and $w_n$ of the synapses may be updated. For example, during the back propagation, the most suitable combination of the model parameters may be found in a direction of minimizing loss according to a cost function.

Figure 2:
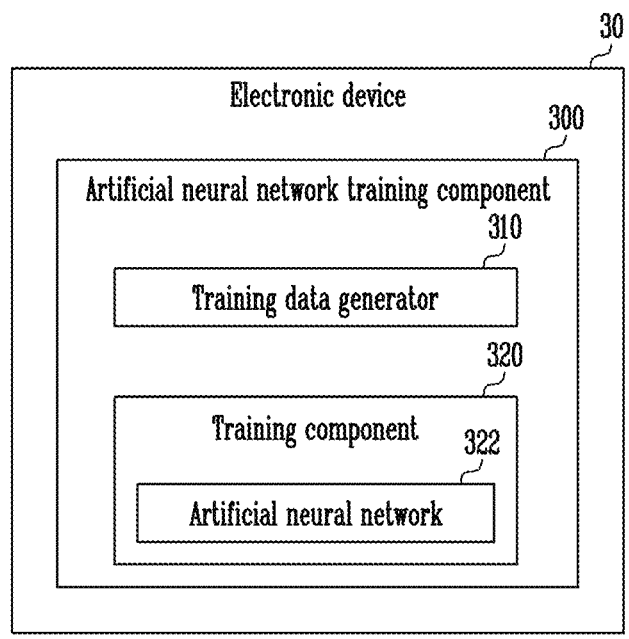
FIG. 2 is an exemplary diagram for describing an electronic device according to an embodiment of the disclosed technology.

FIG. 2 is an exemplary diagram for describing an electronic device according to an embodiment of the disclosed technology.

The electronic device 30 is a device that calculates or processes information in an electronic form using an electronic circuit. For example, the electronic device 30 may include a computer, a memory controller, an error correction circuit, or an error correction decoder. According to an embodiment, the electronic device 30 may be included in the memory controller, the error correction circuit, or the error correction decoder.

The electronic device 30 may include an artificial neural network training component 300.

The artificial neural network training component 300 may include a training data generator 310 and a training component 320.

The training data generator 310 may generate at least one training data used to train an artificial neural network 322. Hereinafter, the training data may mean labeled training data.

The training data generator 310 may generate the training data based on a primary syndrome vector (hereinafter, referred to as a primary test syndrome vector) generated during test error correction decoding using a first error correction decoding algorithm for a test read vector, and decoding result information (hereinafter, referred to as test decoding result information) indicating whether the test error correction decoding is successful. The primary test syndrome vector and the test decoding result information may be received from an external device present outside the electronic device 30 or from an internal device present inside the electronic device 30. In implementations, at least one of the external device or the internal device may be the error correction circuit or the error correction decoder.

In an embodiment, the training data generator 310 may perform hard labeling on the primary test syndrome vector according to the test decoding result information. The hard labeling may mean setting a label value of the output neuron corresponding to a class to a discrete binary value. The label value may mean a value input to the output neurons present in the output layer when the artificial neural network 322 is trained.

In an embodiment in which the output neuron corresponding to the success class and the output neuron corresponding to the fail class are present in the output layer of the artificial neural network 322, when the test decoding result information indicates that the test error correction decoding is successful, the training data generator 310 may performing hard labeling that the primary test syndrome vector is the success class. This may mean that a label value of the output neuron corresponding to the success class is set to "1" and a label value of the output neuron corresponding to the fail class is set to "0".

In an embodiment in which the output neuron corresponding to the success class and the output neuron corresponding to the fail class is present in the output layer of the artificial neural network 322, the training data generator 310 may performing hard labeling that the primary test syndrome vector is the fail class when the test decoding result information indicates that the test error correction decoding is failed. This may mean that the label value of the output neuron corresponding to the success class is set to "0" and the label value of the output neuron corresponding to the fail class is set to "1".

In an embodiment in which only the output neurons corresponding to the success class is present in the output layer of the artificial neural network 322, performing the hard labeling that the primary test syndrome vector is the success class may mean that setting the label value of the output neuron corresponding to the success class to '1', and performing the hard labeling that the primary test syndrome vector is the fail class may mean setting the label value of the output neuron corresponding to the success class to '0'.

The training component 320 may train the artificial neural network 322 according to the supervised learning method using the training data received from the training data generator 310, that is, the hard labeled primary test syndrome vector.

Figure 3:
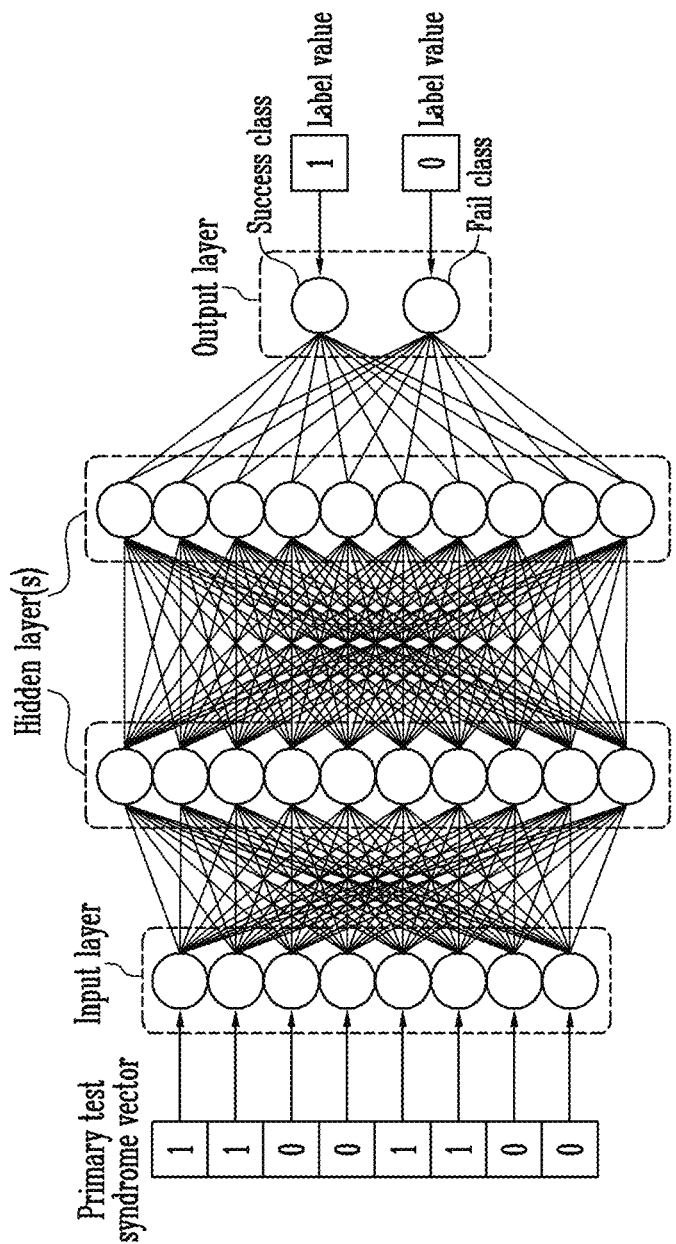
FIGS. 3 and 4 are exemplary diagrams for describing an example of training an artificial neural network.
Figure 4:
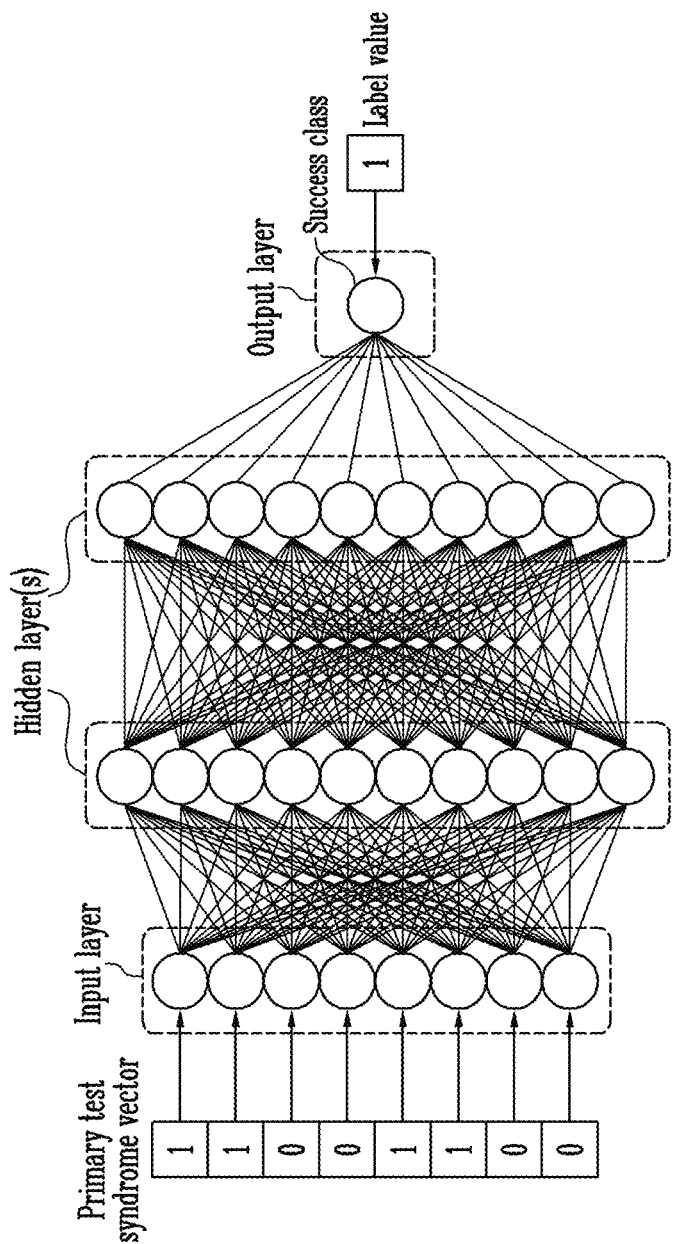

FIGS. 3 and 4 are exemplary diagrams for describing an example of training the artificial neural network.

Some of hyper parameters required for the training of the artificial neural network, for example, at least one of the number of hidden layers, the number of hidden neurons, and a training rate may be arbitrarily or experimentally determined.

The number of input neurons present in the input layer among the hyper-parameters required for training the artificial neural network may be determined according to a length of the syndrome vector generated during the error correction decoding. For example, when an (n, k) code is used, a syndrome vector of n-k binary values may be generated during the error correction decoding. Therefore, when (n, k) code is used during the error correction decoding, the number of input neurons may be determined as n-k.

The number of output neurons present in the output layer among the hyper parameters required for the training of the artificial neural network may be arbitrarily or experimentally determined. For example, the number of output neurons may be determined as one or two. An example in which the primary test syndrome vector {11001100} that is hard labeled as the success class is input to the artificial neural network is shown in FIGS. 3 and 4.

As shown in FIG. 3, in an embodiment in which the output neuron corresponding to the success class and the output neuron corresponding to the fail class are present in the output layer, each of binary values included in the primary test syndrome vector {11001100} may be input one by one to the input neurons included in the input layer. In addition, the label value '1' may be input to the output neuron corresponding to the success class, and the label value '0' may be input to the output neuron corresponding to the fail class.

As shown in FIG. 4, in an embodiment in which only the output neuron corresponding to the success class is present in the output layer, each of binary values included in the primary test syndrome vector {11001100} may be input one by one to the input neurons included in the input layer. In addition, the label value '1' may be input to the output neuron corresponding to the success class.

The artificial neural network may be learned based on the input primary test syndrome vector and the label value(s).

Figure 5:
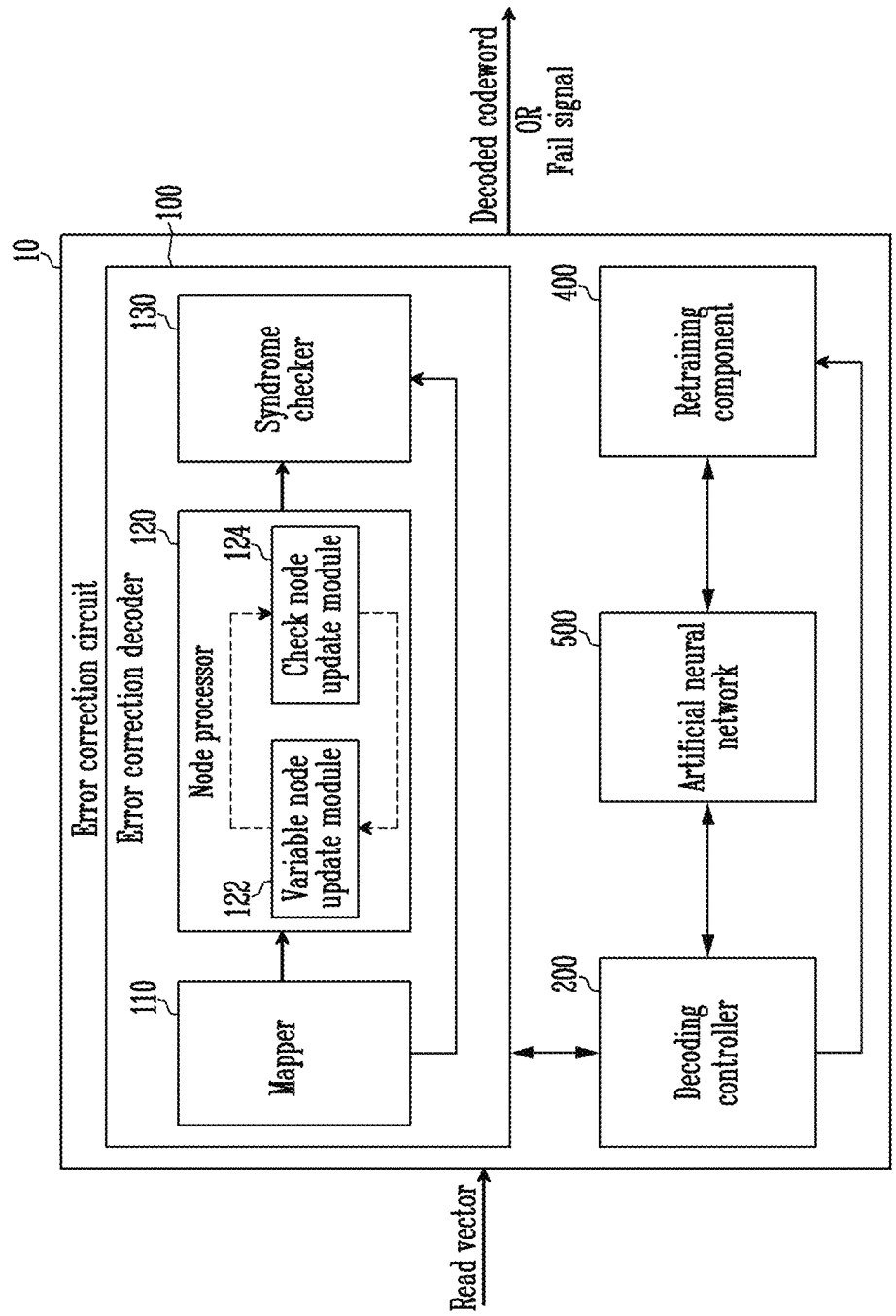
FIG. 5 is an exemplary diagram for describing an error correction circuit according to an embodiment of the disclosed technology.

FIG. 5 is an exemplary diagram for describing the error correction circuit according to an embodiment of the disclosure.

In an embodiment, the error correction circuit 10 shown in FIG. 5 may be included in the electronic device 30 shown in FIG. 2.

In an embodiment, the error correction circuit 10 shown in FIG. 5 may include the electronic device 30 shown in FIG. 2.

In an embodiment, an artificial neural network 500 shown in FIG. 5 may include the artificial neural network 322 shown in FIG. 2.

Referring to FIG. 5, the error correction circuit 10 may include an error correction decoder 100, a decoding controller 200, the artificial neural network 500, and a retraining component 400.

The error correction decoder 100 may receive a vector corresponding to a codeword from a channel. When the error correction circuit 10 is applied to a memory system, the vector received from the channel may be a read vector read from a memory device.

The error correction decoder 100 may perform error correction decoding using various algorithms employing an iterative decoding scheme. For example, the error correction decoder 100 may perform the error correction decoding using a message passing algorithm (MPA) which is also referred to as a belief propagation algorithm (BPA).

In an embodiment, the error correction decoder 100 may perform the error correction decoding using at least one of a bit-flipping algorithm, a min-sum algorithm, or a sum-product algorithm, but embodiments of the disclosed technology are not limited thereto.

The error correction decoder 100 may perform at least one iteration within the maximum number of iterations (I) set according to the selected algorithm. In some implementations, the iteration is referred to as i-th iteration with the iteration number (i) that is less than I. Here, i and I may be natural numbers. When a valid codeword that satisfies constraints of a parity check matrix of an error correction code within the maximum number of iterations (I) is generated, the error correction decoder 100 may output the generated valid codeword as a decoded codeword. When the valid codeword that satisfies the constraints of the parity check matrix of the error correction code is not generated within the maximum number of iterations (I), the error correction decoder 100 may output a fail signal indicating that the error correction decoding is failed.

The error correction decoder 100 may include a mapper 110, a node processor 120, and a syndrome checker 130.

The mapper 110 may receive the read vector from the channel. The read vector may be, for example, a result of reading a codeword stored in the memory device. Each of the read values included in the read vector may be '0' or '1'. The mapper 110 may provide the received read vector to the syndrome checker 130.

The syndrome checker 130 may perform a primary syndrome check based on the read vector received from the mapper 110 and the parity check matrix of the error correction code. For example, the primary syndrome check may be performed by checking whether all entries of a syndrome vector $S_p$ calculated by Equation 2 are '0'.

$$S_p = H \cdot R^T$$

Here, $S_p$ represents the primary syndrome vector, H represents the parity check matrix of the error correction code, and $R^T$ represents transposition of the read vector R.

In a case where all entries of the primary syndrome vector $S_p$ are '0', the case means that a primary syndrome check is passed. Therefore, the syndrome checker 130 may output the read vector as the decoded codeword.

On the other hand, in a case where there is an entry other than '0' among the entries of the primary syndrome vector $S_p$, the case means that the primary syndrome check is failed. This means that the read vector has an error. When the primary syndrome check is failed, the syndrome checker 130 may provide the primary syndrome vector to the decoding controller 200.

The decoding controller 200 may select an algorithm to be used in the error correction decoder 100 and control the error correction decoder 100 to perform the error correction decoding according to the selected algorithm.

In an embodiment, the decoding controller 200 may select an algorithm to be used in the error correction decoder 100 in correspondence with the read vector, using the primary syndrome vector and the artificial neural network 500. The primary syndrome vector may be a syndrome vector generated based on the read vector and the parity check matrix. In an embodiment, the artificial neural network 500 may be trained in advance to output at least one of a first predicted value corresponding to the success class and a second predicted value corresponding to the fail class in correspondence with the input primary syndrome vector.

The first predicted value corresponding to the success class may be a value indicating a probability of a success of the error correction decoding when the error correction decoding on the read vector is performed using the first error correction decoding algorithm. The second predicted value corresponding to the fail class may be a value indicating a probability of a failure of the error correction decoding when the error correction decoding on the read vector using the first error correction decoding algorithm is performed.

For example, in an embodiment in which the output neuron corresponding to the success class and the output neuron corresponding to the fail class are present in the output layer of the artificial neural network 500, the artificial neural network 500 may be trained in advance to output the first predicted value corresponding to the success class and the second predicted value corresponding to the fail class.

For example, in an embodiment in which only the output neuron corresponding to the success class is present in the output layer of the artificial neural network 500, the artificial neural network 500 may be trained in advance to output the first predicted value corresponding to the success class.

The decoding controller 200 may input the primary syndrome vector to the input layer of the artificial neural network 500, and may select the algorithm to be used in the error correction decoder 100 in correspondence with the read vector among the first error correction decoding algorithm and the second error correction decoding algorithm, based on an output of the artificial neural network 500. The output of the artificial neural network 500 may include at least one of the first predicted value and the second predicted value.

In an embodiment in which the output of the artificial neural network 500 includes the first predicted value or includes the first and second predicted values, the decoding controller 200 may select the first error correction decoding algorithm when the first predicted value is equal to or greater than a first reference value and may select the second error correction decoding algorithm when the first predicted value is less than the first reference value. The first reference value may be a preset value. In an embodiment, the first predicted value may be a probability value to which logistic regression is applied.

In an embodiment in which the output of the artificial neural network 500 includes the first and second predicted values, the first reference value may be the second predicted value. That is, the first error correction decoding algorithm may be selected when the first predicted value is equal to or greater than the second predicted value, and the second error correction decoding algorithm may be selected when the first predicted value is less than the second predicted value.

In an embodiment, the first error correction decoding algorithm may be an algorithm, as compared to the second error correction decoding algorithm, that consumes less resources, has a faster arithmetic operation rate, or has a lower error correction capability. For example, the first error correction decoding algorithm may be a bit-flipping algorithm and the second error correction decoding algorithm may be a min-sum algorithm or a sum-product algorithm. For example, the first error correction decoding algorithm may be a min-sum algorithm and the second error correction decoding algorithm may be a sum-product algorithm.

The decoding controller 200 may control at least one of the mapper 110 and the error correction decoder 100 so that the error correction decoding may be performed using the error correction decoding algorithm selected based on the output of the artificial neural network 500.

In an embodiment, the decoding controller 200 may further select a power mode of the error correction decoding algorithm based on the output of the artificial neural network 500. The power mode may include a high power mode and a low power mode. The high power mode may be a mode in which higher power is consumed in comparison with the low power mode during the error correction decoding.

For example, in an embodiment in which the output of the artificial neural network 500 includes the first predicted value or includes the first and second predicted values, when the first predicted value is equal to or greater than the first reference value and less than the second reference value, the decoding controller 200 may select the high power mode of the first error correction decoding algorithm, and when the first predicted value is equal to or greater than the second reference value, the decoding controller 200 may select the low power mode of the first error correction decoding algorithm.

For example, in an embodiment in which the output of the artificial neural network 500 includes the first predicted value only or includes both of the first and second predicted values, when the first predicted value is less than the first reference value and equal to or greater than a third reference value, the decoding controller 200 may select the low power mode of the second error correction decoding algorithm, and when the first predicted value is less than the third reference value, the decoding controller 200 may select the high power mode of the second error correction decoding algorithm. The second reference value and the third reference value may be arbitrarily or experimentally determined.

For example, the low power mode may be a power mode corresponding to hard decision decoding, and the high power mode may be a power mode corresponding to soft decision decoding. For example, the low power mode may be a min-sum algorithm that performs the hard decision decoding, and the high power mode may be a min-sum algorithm that performs the soft decision decoding.

For example, the low power mode may be a power mode in which an unreliability value of a variable node is not used, and the high power mode may be a power mode in which the unreliability value of the variable node is used. When the unreliability value is used, since an additional memory and an additional process are required, power consumption may be higher than a case where the unreliability value is not used. For example, the number of unsatisfied check nodes (UCNs) connected to the variable node is required to be equal to or greater than a first threshold value so that a value of the variable node flips during the error correction decoding using the bit-flipping algorithm. However, even though the variable node is a variable node of which the number of connected UCNs is less than the first threshold value, it is difficult to guarantee reliability of the value of the variable node when the number of connected UCNs is large. Therefore, a method of setting the unreliability value at the variable node may be used. For example, after setting unreliability at the variable node where the number of connected UCNs is equal to or greater than a second threshold value and less than the first threshold value, when the number of UCNs connected to the variable node is equal to or greater than the second threshold value and less than the first threshold value again in a subsequent iteration, the value of the variable node may be flipped. The first threshold value and the second threshold value may be arbitrarily or experimentally determined.

For example, the low power mode may be a power mode that uses relatively low bit precision as compared to the high power mode. For example, when a min-sum algorithm is used, messages (for example, messages represented by an LLR (log likelihood ratio) value) having a real value are exchanged between variable nodes and check nodes. As the bit precision of the messages increases, an error correction capability may increase, but power consumption may increase.

The decoding controller 200 may control the error correction decoder 100 to perform the error correction decoding using the selected power mode of the selected error correction algorithm.

When the bit-fliping algorithm is selected, the mapper 110 may provide the read vector to the node processor 120.

When the min-sum algorithm or the sum-product algorithm is selected, the mapper 110 may generate an initial log likelihood ratio (LLR) vector based on the read vector, and provide the initial LLR vector to the node processor 120. The initial LLR vector may be generated from one read vector corresponding to one codeword when the low power mode is selected, and the initial LLR vector may be generated from a plurality of read vectors corresponding to one codeword when the high power mode is selected. The plurality of read vectors corresponding to the one codeword may be read vectors obtained by using different read voltages.

The node processor 120 may perform the error correction decoding using a message transfer algorithm. According to the message transfer algorithm, a result of convergence to a codeword may be generated through exchange of messages between the variable nodes and the check nodes. The message may include a variable to check (V2C) message transmitted from the variable node to the check node and a check to variable (C2V) message transmitted from the check node to the variable node.

The node processor 120 may perform at least one iteration within the maximum number of iterations (I). The node processor 120 may include a variable node update module 122 and a check node update module 124.

When the bit-fliping algorithm is selected, the variable node update module 122 may initialize the variable nodes using the read vector received from the mapper 110. For example, the variable node update module 122 may assign read values included in the read vectors one by one to each of the variable nodes.

When the min-sum algorithm or the sum-product algorithm is selected, the variable node update module 122 may initialize the variable nodes using the initial LLR vector received from the mapper 110. For example, the variable node update module 122 may allocate initial LLR values included in the initial LLR vector one by one to each of the variable nodes.

In each iteration, the variable node update module 122 may generate the V2C messages according to a currently selected algorithm and transmit the generated V2C messages to the check node update module 124. The V2C messages may be generated based on the read values allocated to the variable nodes or the initial LLR values, and the C2V messages received from check node update module 124. In each iteration, the variable node update module 122 may update the values of the variable nodes according to the currently selected algorithm. The values of the variable nodes may be updated based on the read values allocated to the variable nodes or the initial LLR values, and the C2V messages received from the check node update module 124. The values of the variable nodes may include at least one of a hard decision value of the variable nodes, a posteriori probability of the variable nodes, and an unreliability value of the variable nodes.

In each iteration, the check node update module 124 may generate the C2V messages according to the currently selected algorithm, and transmit the generated C2V messages to the variable node update module 122. The C2V messages may be generated based on the V2C messages received from the variable node update module 122.

The variable node update module 122 and the check node update module 124 may generate the V2C messages and the C2V messages according to the bit precision corresponding to the selected power mode. For example, the V2C messages and the C2V messages may be expressed by 4 bits in the low power mode and may be expressed by 8 bits in the high power mode.

The node processor 120 may provide the hard decision values (hereinafter, referred to as a hard decision vector Ci) of the variable nodes corresponding to an i-th iteration. Here, i is a natural number equal to or less than the maximum number of iterations (I).

When the valid codeword satisfying the constraints of the parity check matrix of the error correction code is generated within the maximum number of iterations (I), the syndrome checker 130 may output the generated valid codeword as the decoded codeword. For example, the syndrome checker 130 may perform a syndrome check on the hard decision vector (Ci) received from the node processor 120 in correspondence with the i-th iteration. For example, the syndrome check may be performed by checking whether all entries of a syndrome vector Si calculated by Equation 3 are '0'.

$$S_i = H \cdot C_i^T \quad \text{[Equation 3]}$$

where $S_i$ represents the syndrome vector corresponding to the i-th iteration, H represents the parity check matrix of the error correction code, and CiT represents transposition of the hard decision vector Ci corresponding to the i-th iteration.

In a case where all entries of the syndrome vector Si are '0', the case means that the syndrome check is passed. This may mean that the error correction decoding is successfully performed in the i-th iteration, and thus the syndrome checker 130 may output the hard decision vector Ci as the decoded codeword.

On the other hand, in a case where there is an entry other than '0' among the entries of the syndrome vector Si, the case may mean that the syndrome check has failed in the i-th iteration, and thus the node processor 120 may perform an (i+1)-th iteration when the number is within the maximum number of iterations (I).

In an embodiment, the error correction decoder 100 may include at least one of first hardware capable of performing the error correction decoding according to the bit-fliping algorithm, second hardware capable of performing the error correction decoding according to the min-sum algorithm, and third hardware capable of performing the error correction decoding according to the sum-product algorithm. In some implementations, the error correction decoder 100 may include one, two or three of the first to third hardwares. The first hardware may operate when the bit-fliping algorithm is selected, the second hardware may operate when the min-sum algorithm is selected, and the third hardware may operate when the sum-product algorithm is selected. In this case, selecting the algorithm may also mean selecting, among the first to third hard ware, a hardware capable of performing the selected algorithm.

In an embodiment, the first hardware may operate so as not to use the unreliability value of the variable node when the low power mode of the bit flipping algorithm is selected, and the first hardware may operate so as to use the unreliability value of the variable node when the high power mode of the bit flipping algorithm is selected.

In an embodiment, the second hardware may operate so as to use a first bit precision when the low power mode of the min-sum algorithm is selected, and the second hardware may operate so as to use a second bit precision when the high power mode of the min-sum algorithm is selected. The second bit precision may be a precision higher than the first bit precision.

In an embodiment, the second hardware may operate so as not to scale the messages exchanged between the variable nodes and the check nodes when the low power mode of the min-sum algorithm is selected, and the second hardware may operate so as to scale the messages exchanged between the variable nodes and the check nodes when the high power mode of the min-sum algorithm is selected. When the high power mode of the min-sum algorithm is selected, the second hardware may operate according to a scaled min-sum algorithm.

In an embodiment, the third hardware may operate so as to use a third bit precision when the low power mode of the sum-product algorithm is selected, and the third hardware may operate so as to use a fourth bit precision when the high power mode of the sum-product algorithm is selected. The fourth bit precision may be a precision higher than the third bit precision.

In an embodiment, the error correction decoder 100 may include fourth hardware capable of performing the error correction decoding according to at least one of the bit-fliping algorithm, the min-sum algorithm, or the sum-product algorithm. Thus, the fourth hardware may perform the error correction decoding according to the bit-fliping algorithm, perform the error correction decoding according to the min-sum algorithm, or perform the error correction decoding according to the sum-product algorithm. In some implementations, the fourth hardware may operate in the low power mode or the high power mode. When the fourth hardware is included in the error correction decoder 100, the first to third hardware may not be included in the error correction decoder 100.

In an embodiment, each of the first to fourth hardware is hardware capable of generating messages propagated between the variable nodes and the check nodes and updating the values of the variable nodes and the values of the check nodes. For example, each of the first to fourth hardware can be configured as the node processor 120.

The retraining component 400 may retrain the artificial neural network 500 according to a result of the error correction decoding.

In an embodiment, when the first error correction decoding performed according to the first error correction decoding algorithm selected based on the primary syndrome vector and the artificial neural network 500 is failed, the retraining component 400 may retrain the artificial neural network 500 by performing the hard labeling that the primary syndrome vector is the fail class. For example, the retraining component 400 may set the label value corresponding to the fail class corresponding to the probability that the error correction decoding is failed to '1' and input the primary syndrome vector to the input layer of the artificial neural network 500 to retrain the artificial neural network 500.

In an embodiment, when a predicted value indicating the probability that the first error correction decoding is successful, that is, the first predicted value corresponding to the success class is equal to or greater than a fourth reference value that is greater than the first reference value, and thus the first error correction decoding algorithm is selected, but the first error correction decoding using the first error correction decoding algorithm is failed, the retraining component 400 may retrain the artificial neural network 500 using the primary syndrome vector. The fourth reference value may be arbitrarily or experimentally determined.

In an embodiment, when the second error correction decoding performed according to the second error correction decoding algorithm selected based on the primary syndrome vector and the artificial neural network 500 is successful, the retraining component 400 may retrain the artificial neural network 500 by performing the soft labeling that the primary syndrome vector is the success class. In this case, the retraining component 400 may perform retraining in consideration of at least one of an iteration number (i) of the iteration, that is, i-th iteration, where the second error correction decoding is successful or the number of error bits corrected as a result of the second error correction decoding. In some implementations, the retraining component 400 may perform retraining in consideration of both of the iteration number (i) and the number of error bits corrected.

The soft labeling may mean setting a value of a label corresponding to a class to a real number between [0, 1]. For example, in an embodiment in which the output neuron corresponding to the success class and the output neuron corresponding to the fail class are present in the output layer, the soft labeling may mean setting each of label values to a real value between [0, 1] within a range causing a sum of the label value of the output neuron corresponding to the success class and the label value of the output neuron corresponding to the fail class is to be 1. For example, in an embodiment in which only the output neuron corresponding to the success class is present in the output layer, the soft labeling may mean setting the label value of the output neuron corresponding to the success class to a real number greater than 0 and less than 1.

In an embodiment, when the iteration number (i) of the iteration where the second error correction decoding is successful is equal to or less than a fifth reference value, the retraining component 400 may retrain the artificial neural network 500 by performing the soft labeling that the primary syndrome vector is the success class. The fifth reference value may be arbitrarily or experimentally determined within the maximum number of the iterations.

In an embodiment, the retraining component 400 may set a higher label value corresponding to the success class corresponding to the probability that the first error correction decoding is successful as the iteration number (i) of the iteration where the second error correction decoding is successful is lower. For example, the retraining component 400 may set the label value corresponding to the success class to '0.8' when the iteration number of the iteration where the second error correction decoding is successful is 3, and may set the label value corresponding to the success class to '0.7' when the iteration number of the iteration where the second error correction decoding is successful is 5.

In an embodiment, when the number of error bits corrected as a result of the second error correction decoding is equal to or less than a sixth reference value, the retraining component 400 may retrain the artificial neural network 500 by performing the soft labeling that the primary syndrome vector is the success class. The sixth reference value may be arbitrarily or experimentally determined.

In an embodiment, the retraining component 400 may set a higher label value corresponding to the success class corresponding to the probability that the first error correction decoding is successful as the number of error bits corrected as a result of the second error correction decoding is lower. For example, when the number of error bits corrected as a result of the second error correction decoding is three, the retraining component 400 may set the label value corresponding to the success class to '0.8', and when the number of error bits corrected as a result of the second error correction decoding is five, the retraining component 400 may set the label value corresponding to the success class to '0.7'.

Figure 6:
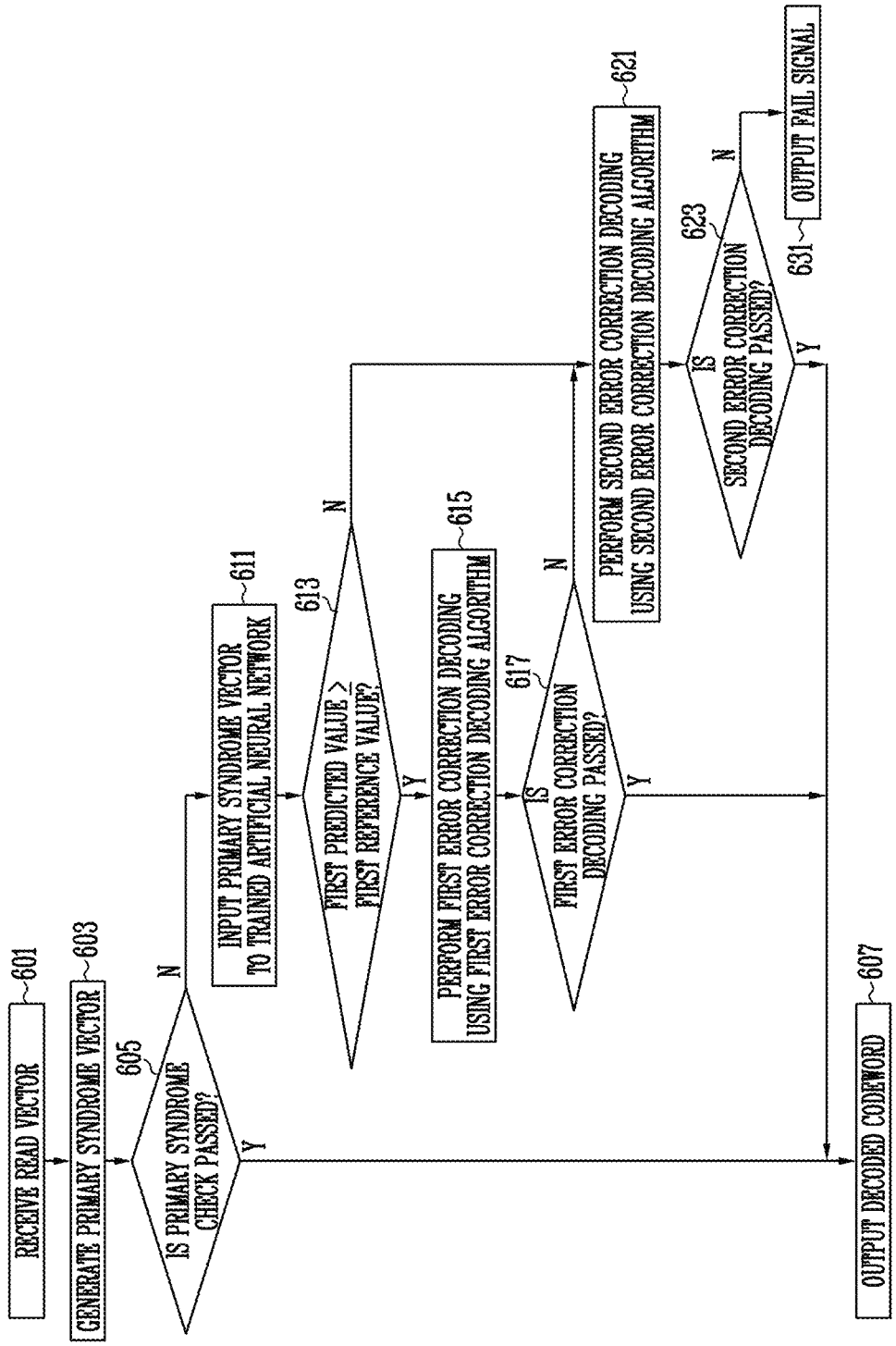
FIG. 6 is a flowchart for describing a method of operating an electronic device according to an embodiment of the disclosed technology.

FIG. 6 is a flowchart for describing a method of operating the electronic device according to an embodiment of the disclosed technology.

In step 601, the electronic device 30 may receive the read vector corresponding to the codeword from the channel. For example, the read vector may be received from the memory device.

In step 603, the electronic device 30 may generate the primary syndrome vector. For example, the electronic device 30 may generate the primary syndrome vector based on the read vector and the parity check matrix of the error correction code.

In step 605, the electronic device 30 may determine whether the primary syndrome check is passed. For example, when all entries included in the primary syndrome vector are '0', it may be determined that the primary syndrome check is passed, and when at least one of all entries included in the primary syndrome vector is '1', it may be determined that the primary syndrome check is failed.

When the primary syndrome check is passes (Y) as a result of the determination of step 605, in step 607, the decoded codeword may be output.

When the primary syndrome check is failed (N) as a result of the determination of step 605, in step 611, the electronic device 30 may input the primary syndrome vector to the input layer of the trained artificial neural network.

In step 613, the electronic device 30 may determine whether the first predicted value corresponding to the probability that the first error correction decoding algorithm is successful among the outputs of the trained artificial neural network is equal to or greater than the first reference value. The first predicted value may be a probability to which logistic regression is applied. When the first predicted value is equal to or greater than the first reference value (Y) as a result of the determination of step 613, in step 615, the first error correction decoding may be performed using the first error correction decoding algorithm. At least one iteration may be performed within the maximum number of iterations during the first error correction decoding.

In step 617, the electronic device 30 may determine whether the first error correction decoding is passed.

When the first error correction decoding is passed (Y) as a result of the determination of step 617, in step 607, the decoded codeword may be output.

When the first predicted value is less than the first reference value (N) as a result of the determination of step 613 or when the first error correction decoding is failed (N) as a result of the determination of step 617, in step 621, the second error correction decoding using the second error correction decoding algorithm may be performed. At least one iteration may be performed within the maximum number of iterations during the second error correction decoding.

In step 623, the electronic device 30 may determine whether the second error correction decoding is passed.

When the second error correction decoding is passed (Y) as a result of the determination of step 623, in step 607, the decoded codeword may be output.

When the second error correction decoding is failed (N) as a result of the determination of step 623, in step 631, a fail signal indicating that the second error correction decoding is failed may be output.

According to an embodiment, in step 613, the power mode of the error correction decoding algorithm may be further determined. For example, the high power mode of the first error correction decoding algorithm may be selected when the first predicted value is equal to or greater than the first reference value and less than the second reference value, and the low power mode of the first error correction decoding algorithm may be selected when the first predicted value is equal to or greater than the second reference value. For example, the low power mode of the second error correction decoding algorithm may be selected when the first predicted value is less than the first reference value and equal to or greater than the third reference value, and the high power mode of the second error correction decoding algorithm may be selected when the first predicted value is less than the third reference value.

Meanwhile, although not shown in FIG. 6, as described above, the electronic device 30 may retrain the artificial neural network 322 according to a result of at least one of the first error correction decoding and the second error correction decoding. This will be described in detail with reference to FIGS. 7 and 8.

Figure 7:
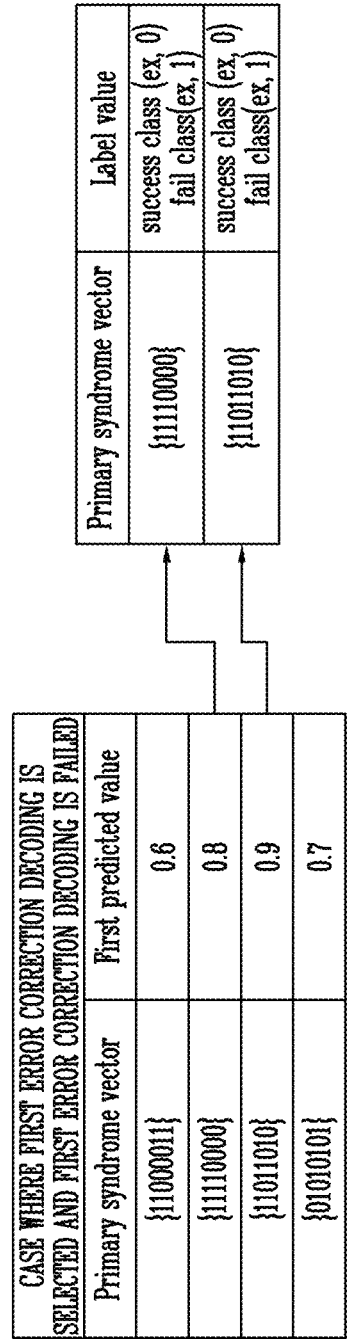
FIG. 7 is an exemplary diagram for describing a method of retraining a trained artificial neural network according to an embodiment of the disclosed technology.

FIG. 7 is an exemplary diagram for describing a method of retraining the artificial neural network trained according to an embodiment of the disclosed technology.

When the first error correction decoding algorithm is selected based on the first predicted value of the artificial neural network 322 corresponding to the primary syndrome vector, but the error correction decoding using the first error correction decoding algorithm is failed, the electronic device 30 may retrain the artificial neural network 322 by performing the hard labeling that the primary syndrome vector is the fail class.

In an embodiment of the disclosed technology, the electronic device 30 may retrain the artificial neural network 322 by performing the hard labeling that primary syndrome vector, which causes the first predicted value of the syndrome vectors to be equal to or greater than the fourth reference value, is the fail class.

For example, in the example shown in FIG. 7, when the fourth reference value is 0.8, the electronic device 30 may perform the hard labeling that the primary syndrome vectors {11110000} and {11011010}, which cause the first predicted value corresponding to the success class is to be equal to or greater than 0.8, is the failure class. That is, the electronic device 30 may set the label value of the success class to '0' and the label value of the fail class to '1' in correspondence with the primary syndrome vectors {11110000} and {11011010}.

Figure 8:
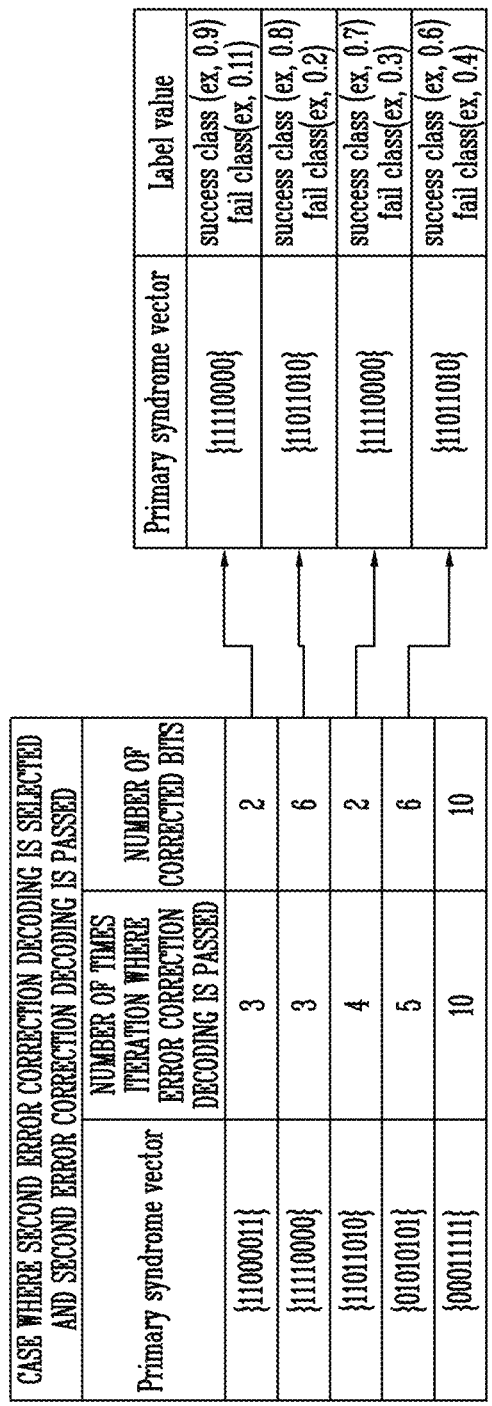
FIG. 8 is an exemplary diagram for describing a method of retraining the trained artificial neural network according to an embodiment of the disclosed technology.

FIG. 8 is an exemplary diagram for describing a method of retraining the artificial neural network trained according to an embodiment of the disclosed technology.

When the second error correction decoding algorithm is selected based on the first predicted value of the artificial neural network 322 corresponding to the primary syndrome vector and the error correction decoding using the second error correction decoding algorithm is successful, the electronic device 30 may retrain the artificial neural network 322 by performing the soft labeling that the primary syndrome vector is the success class.

In an embodiment, when the iteration number of the iteration where the second error correction decoding is successful is equal to or less than the fifth reference value, the electronic device 30 may retrain the artificial neural network 322 by performing the soft labeling that the primary syndrome vector is the success class.

For example, in the example shown in FIG. 8, when the fifth reference value is 9, the electronic device 30 may perform soft labeling that primary syndrome vectors {11000011}, {11110000}, {11011010}, and {01010101} corresponding to the case where the iteration number of the iteration where the second error correction decoding is successful is equal to or less than 9 are the success class. At this time, the electronic device 30 may set a higher label value corresponding to the success class as the iteration number of the iteration where the second error correction decoding is successful is lower.

In an embodiment, when the number of error bits corrected as a result of the second error correction decoding is equal to or less than the sixth reference value, the electronic device 30 may retrain the artificial neural network 322 by performing the soft labeling that the primary syndrome vector is the success class.

For example, in the example shown in FIG. 8, when the sixth reference value is 9, the electronic device 30 may perform soft labeling that primary syndrome vectors {11000011}, {11110000}, {11011010}, and {01010101} corresponding to a case where the number of corrected error bits is equal to or less than 9 is the success class. At this time, the electronic device 30 may set a higher label value corresponding to the success class as the number of corrected error bits is smaller.

FIG. 9 is an exemplary diagram for describing the parity check matrix.

An (N, K) code may be defined as a parity check matrix having a size of M×N. Here, K represents a length of original data, M represents the number of parities, and (M=N−K) is satisfied. Each entry of the parity check matrix may be '0' or '1'. When the number of '1' included in the parity check matrix is relatively less than the number of '0', the (N, K) code may be referred to as an (N, K) LDPC code. Here, N and K may be natural numbers. FIG. 9 shows a parity check matrix H that defines a (7, 4) code, as an example.

A matrix in which each entry is formed of a sub matrix may be referred to as a base matrix. Each entry of the base matrix may be a sub matrix of size z×z. Here, z may be an integer equal to or greater than 2. For example, in a base matrix of a binary LDPC code, '0' may indicate that a corresponding entry is a zero matrix, and '1' may indicate that the corresponding entry is not a zero matrix. For example, in a base matrix of quasi cyclic (QC)-LDPC code, '1' may indicate that the corresponding entry is a cyclic permutation matrix. The cyclic permutation matrix may be a matrix obtained by cyclic shifting an identity matrix by a predetermined shift value, and any one cyclic permutation matrix may have a shift value different from that of another cyclic permutation matrix.

Figure 10:
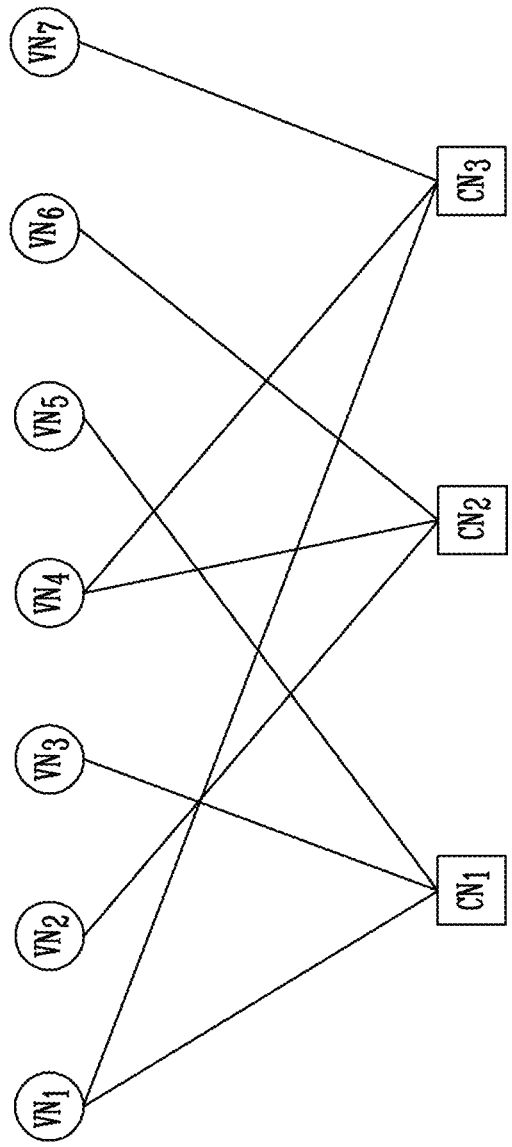
FIG. 10 is a diagram illustrating the parity check matrix shown in FIG. 9 by a Tanner graph.

FIG. 10 is a diagram illustrating the parity check matrix shown in FIG. 9 by a Tanner graph.

The (N, K) code may be expressed by a Tanner graph, which is an equivalent bipartite graph expression. The Tanner graph may be expressed by N-K check nodes, N variable nodes, and edges. The check nodes correspond to rows of the parity check matrix, and the variable nodes correspond to columns of the parity check matrix. Each edge connects one check node and one variable node and represents an entry expressed by '1' in the parity check matrix.

The parity check matrix of (7, 4) code shown in FIG. 9 may be expressed by a Tanner graph including three check nodes CN1 to CN3 and seven variable nodes VN1 to VN7 as shown in FIG. 10. A solid line connecting the check nodes CN1 to CN3 and the variable nodes VN1 to VN7 represents the edge.

Iteration decoding may be performed through exchange of messages repeatedly performed between the check nodes CN1 to CN3 and the variable nodes VN1 to VN7.

Figures 11, 12:
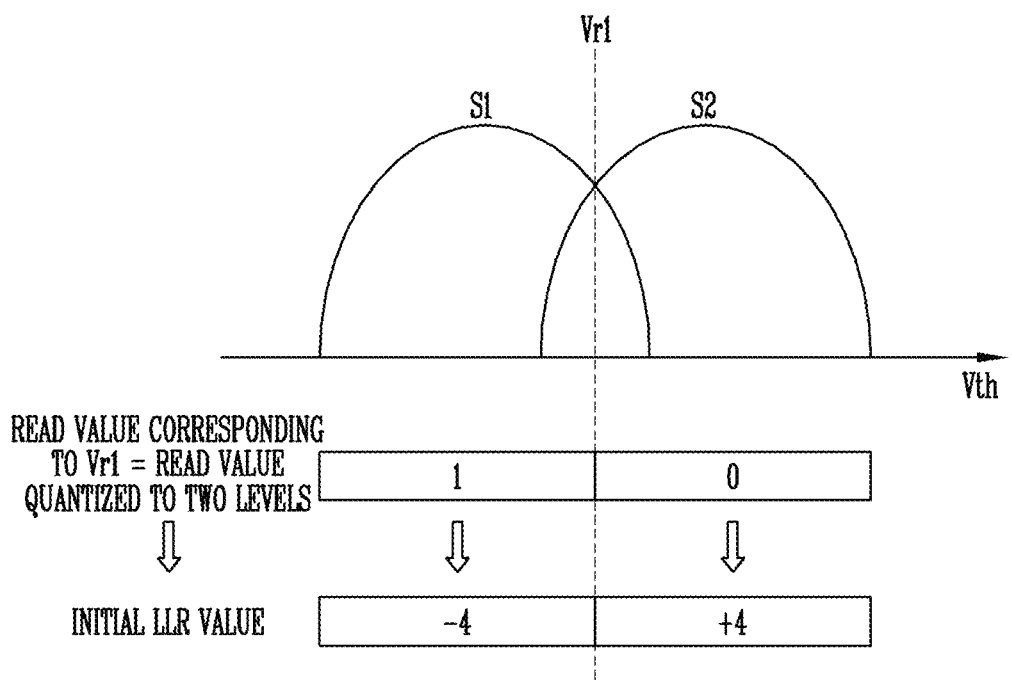
FIG. 11 is an exemplary diagram for describing a syndrome vector calculated using the parity check matrix shown in FIG. 9.
FIG. 12 is an exemplary diagram for describing a process of generating an initial LLR value using one read value during hard decision decoding.

FIG. 11 is an exemplary diagram for describing a syndrome vector calculated using the parity check matrix shown in FIG. 9.

As described above, the syndrome vector $S_i$ may be generated based on the parity check matrix H and the transposition $C_i^T$ of the hard decision vector $C_i$ corresponding to the i-th iteration. Entries $C_{i1}$, $C_{i2}$, $C_{i3}$, ..., and $C_{i7}$ of the hard decision vector $C_i$ represent hard decision values of the variable nodes corresponding to the i-th iteration. Entries $S_{i1}$, $S_{i2}$, and $S_{i3}$ of the syndrome vector $S_i$ correspond to the check node CN1, CN2, and CN3 on the Tanner graph shown in FIG. 10, respectively.

In a case where all entries $S_{i1}$, $S_{i2}$ and $S_{i3}$ of the syndrome vector $S_i$ are '0', the case means that the syndrome check is passed. This means that the error correction decoding is successful in the corresponding iteration. Therefore, the iteration decoding is ended, and the hard decision vector $C_i$ corresponding to the i-th iteration may be output as the decoded codeword.

In a case where at least one of all of entries $S_{i1}$, $S_{i2}$ and $S_{i3}$ of the syndrome vector $S_i$ is not '0', the case means that the syndrome check is failed. This means that the error correction decoding is not successful in the corresponding iteration, and thus a next iteration may be performed when the maximum number of iterations (I) is not reached.

FIG. 12 is an exemplary diagram for describing a process of generating the initial LLR value using one read value during the hard decision decoding.

FIG. 12 shows a distribution of a threshold voltage Vth of memory cells each having any one of a first state S1 and a second state S2.

In order to obtain one read vector corresponding to one codeword, one read voltage may be applied to a plurality of memory cells.

For example, when a first read voltage Vr1 is applied to the plurality of memory cells, a read value for a memory cell having a threshold voltage lower than the first read voltage Vr1 may be represented as '1', and a read value for a memory cell having a threshold voltage higher than the first read voltage Vr1 may be represented as '0'. For example, as shown in FIG. 12, when one read voltage, that is, the first read voltage Vr1 is used, one read value may be obtained for each one memory cell.

The error correction decoder may determine the first read value itself corresponding to the first read voltage Vr1. The first read value may be selected between two quantized levels. Thus, the error correction decoder may determine the read value quantized to predetermined levels, for example, two.

The error correction decoder may convert the read value into the initial LLR value. The conversion to the initial LLR value may be performed by referring to a lookup table has been set.

Figure 13:
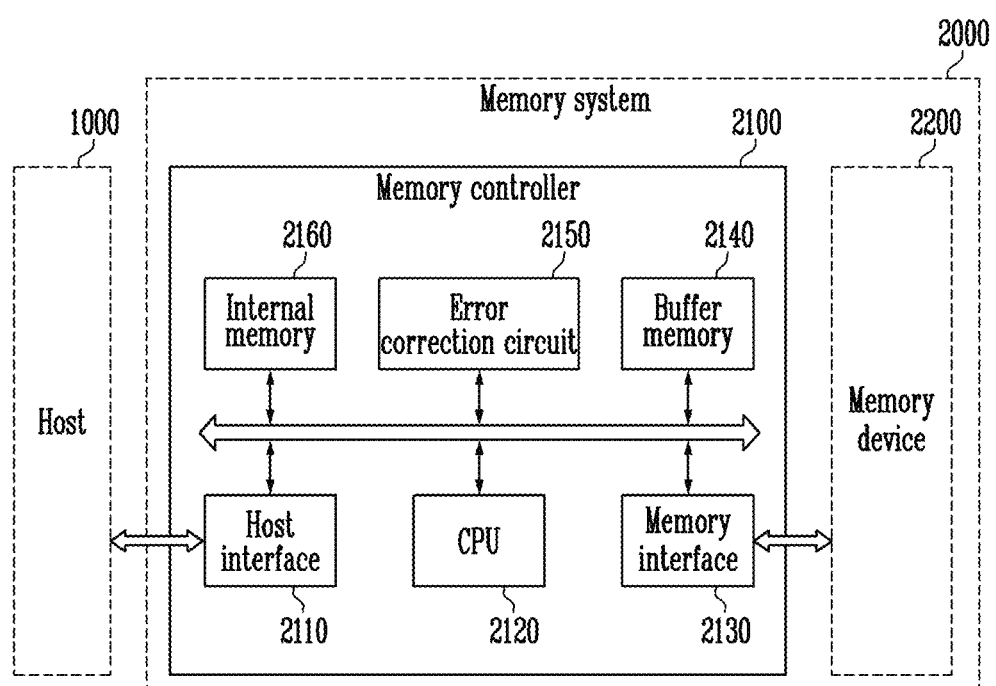
FIG. 13 is an exemplary diagram for describing a memory system according to an embodiment of the disclosed technology.

FIG. 13 is an exemplary diagram for describing a memory system according to an embodiment of the disclosed technology.

The memory system 2000 may include a memory device 2200 in which data is stored and a memory controller 2100 controls the memory device 2200 according to a request of a host 1000.

The host 1000 may be a device or a system that stores data in the memory system 2000 or retrieves data from the memory system 2000. For example, the host 1000 may include at least one of a computer, a portable digital device, a tablet, a digital camera, a digital audio player, a television, a wireless communication device, and a cellular phone, but embodiments of the disclosed technology are not limited thereto.

The memory controller 2100 may control overall operations of the memory system 2000. The memory controller 2100 may perform various operations according to a request from the host 1000. The memory controller 2100 may perform at least one of a program operation of storing data in the memory device 2200, a read operation of reading data stored in the memory device 2200, and an erase operation of erasing the data stored in the memory device 2200.

The memory controller 2100 may include a host interface 2110, a central processing unit 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the central processing unit 2120.

The host interface 2110 may communicate with the host 1000 using various interface protocols. For example, the host interface 2110 may communicate with the host 100 using at least one interface among a non-volatile memory express (NVMe), a peripheral component interconnect-express (PCI-E), an advanced technology attachment (ATA), a serial ATA (SATA), a parallel ATA (PATA), a universal serial bus (USB), a multi-media card (MMC), an enhanced small disk interface (ESDI), integrated drive electronics (IDE), a mobile industry processor interface (MIPI), a universal flash storage (UFS), a small computer system interface (SCSI), or a serial attached SCSI (SAS), but embodiments of the disclosed technology are not limited thereto.

The central processing unit 2120 may perform various operations or generate a command and an addresses to control the memory device 2200. For example, the central processing unit 2120 may generate various commands and addresses necessary for the program operation, the read operation, the erase operation, and the like, according to the request received from the host 1000, and transmit the commands and the addresses to the memory device 2200.

The central processing unit 2120 may convert a logical address included in the request received from the host 1000 into a physical address in order to control an operation of the memory device 2200. The central processing unit 2120 may convert the logical address into the physical address or convert the physical address into the logical address using an address mapping table stored in the internal memory 2160. The central processing unit 2120 may update the address mapping table when new data is programmed in the memory device 2200 or data stored in the memory device 2200 is erased.

The central processing unit 2120 may randomize data during the program operation and de-randomize the data during the read operation.

The memory interface 2130 may communicate with the memory device 2200 using various interface protocols.

The buffer memory 2140 may temporarily store data while the memory controller 2100 controls the memory device 2200. For example, program data received from the host 1000 may be temporarily stored in the buffer memory 2140 until the program operation is completed. In addition, during the read operation, data read from the memory device 2200 may be temporarily stored in the buffer memory 2140.

The error correction circuit 2150 may perform error correction encoding on the program data and error correction decoding on the read data. The error correction circuit 2150 may have a certain level of error correction capability. For example, the error correction circuit 2150 may detect and correct an error included in the read data when an error bit of the number that does not exceed the error correction capability is present in the read data. The maximum number of error bits that do not exceed the error correction capability of the error correction circuit 2150 may be referred to as a maximum number of permission error bits. When an error bit of the number exceeding the maximum number of permission error bits is present in the read data, the error correction decoding may be failed.

The error correction circuit 2150 may perform the error correction decoding according to the error correction decoding algorithm selected using the artificial neural network. The error correction circuit 2150 may retrain the trained artificial neural network using the result of the error correction decoding.

The error correction circuit 2150 may be the error correction circuit 10 described with reference to FIG. 5.

The internal memory 2160 may be used as a storage that stores various pieces of information required for an operation of the memory controller 2100. The internal memory 2160 may store a plurality of tables. For example, the internal memory 2160 may store an address mapping table in which the logical address and the physical address are mapped to each other.

The memory device 2200 may be configure of a volatile memory device in which stored data is lost when power supply is cut off, or a non-volatile memory device in which stored data is maintained even though power supply is cut off. The memory device 2200 may perform the program operation, the read operation, the erase operation, and the like according to control of the memory controller 2100.

The memory device 2200 may include at least one storage area for storing data. The storage area may correspond to one page including a plurality of memory cells, one memory block including a plurality of pages, one plane including a plurality of memory blocks, or one die including a plurality of pages. However, embodiments of the disclosed technology are not limited thereto.

Figure 14:
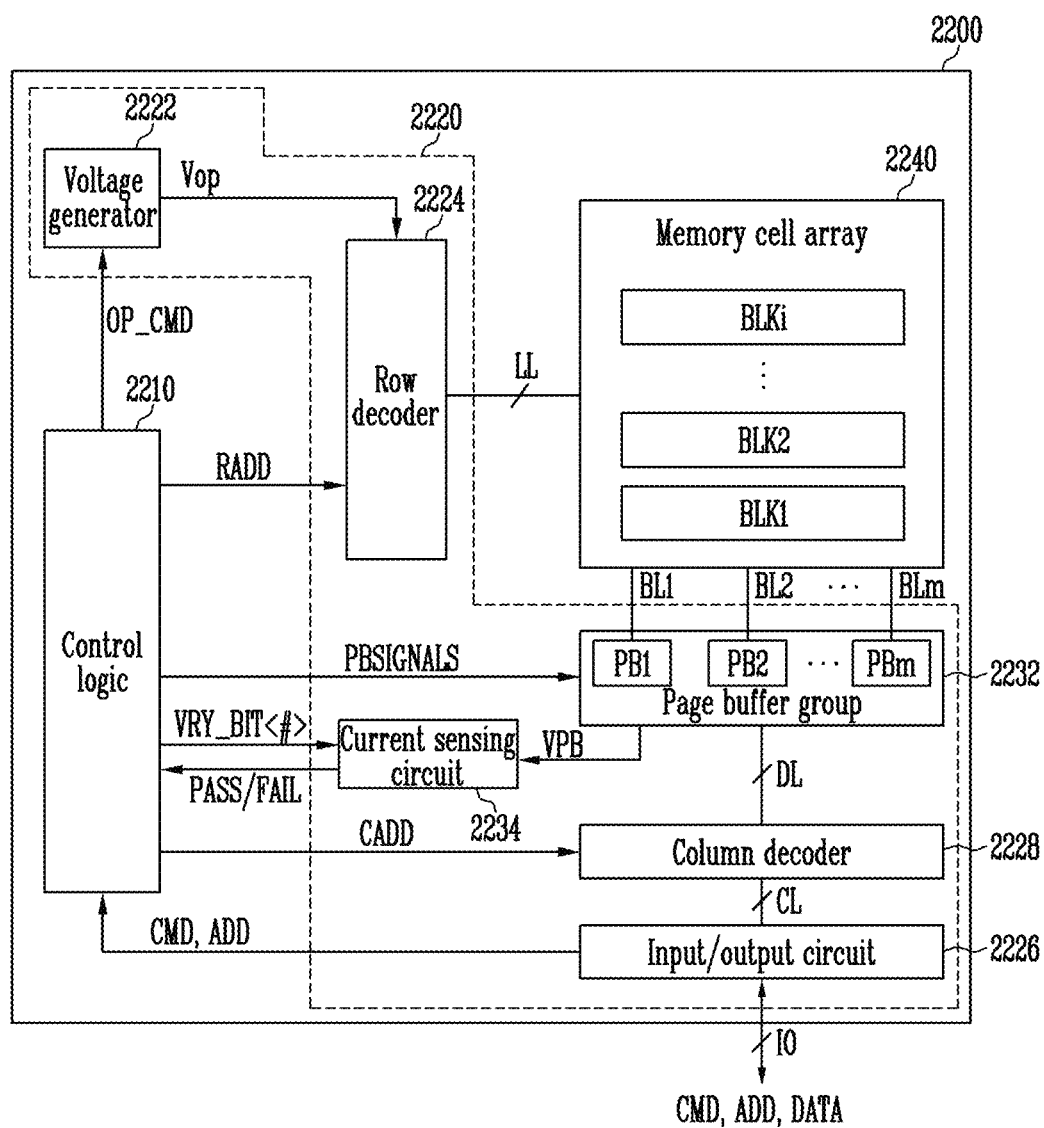
FIG. 14 is a diagram for describing the memory device according to an embodiment.

FIG. 14 is a diagram for describing the memory device according to an embodiment.

The memory device 2200 may include a control logic 2210, peripheral circuits 2220, and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 shown in FIG. 13.

The control logic 2210 may control the peripheral circuits 2220 in response to the command CMD and the address ADD received from the memory controller 2100 through the input/output circuit 2226. For example, the control logic 2210 may output an operation signal OP_CMD, a row address RADD, a column address CADD, page buffer control signals PBSIGNALS, and a permission bit VRY_BIT<#> in response to the command CMD and the address ADD. The control logic 2210 may determine whether a verify operation is passed or failed in response to a pass signal PASS or a fail signal FAIL received from the current sensing circuit 2234.

The peripheral circuits 2220 may perform a program operation of storing data in the memory cell array 2240, a read operation of outputting data stored in the memory cell array 2240, and an erase operation of erasing the data stored in the memory cell array 2240.

The voltage generation circuit 2222 may generate various operation voltages Vop used for the program operation, the read operation, and the erase operation in response to the operation signal OP_CMD received from the control logic 2210. For example, the voltage generation circuit 2222 may transfer a program voltage, a verify voltage, a pass voltage, a read voltage, an erase voltage, a turn-on voltage, and the like to the row decoder 2224.

The row decoder 2224 may transfer the operation voltages Vop to local lines LL connected to a selected memory block among memory blocks included in the memory cell array 2240 in response to the row address RADD received from the control logic 2210. The local lines LL may include local word lines, local drain select lines, and local source select lines. In addition, the local lines LL may include various lines connected to a memory block such as a source line.

The input/output circuit 2226 may transfer the command CMD and the address ADD received from the memory controller through input/output lines IO to the control logic 2210 or exchange data DATA with the column decoder 2228.

The column decoder 2228 may transfer data between the input/output circuit 2226 and the page buffer group 2232 in response to the column address CADD received from the control logic 2210. For example, the column decoder 2228 may exchange data with page buffers PB1 to PBm through data lines DL, or exchange data with the input/output circuit 2226 through the column lines CL.

The page buffer group 2232 may be connected to bit lines BL1 to BLm commonly connected to memory blocks BLK1 to BLKi. The page buffer group 2232 may include a plurality of page buffers PB1 to PBm connected to the bit lines BL1 to BLm. For example, one page buffer may be connected to each bit line. The page buffers PB1 to PBm may operate in response to the page buffer control signals PBSIGNALS received from the control logic 2210. For example, during the program operation, the page buffers PB1 to PBm may temporarily store program data received from the memory controller and adjust a voltage applied to the bit lines BL1 to BLm according to the program data. In addition, during the read operation, the page buffers PB1 to PBm may temporarily store data received through the bit lines BL1 to BLm or may sense a voltage or a current of the bit lines BL1 to BLm.

During the read operation or the verify operation, the current sensing circuit 2234 may generate a reference current in response to the permission bit VRY_BTI<#> received from the control logic 2210, and compare a reference voltage generated by the reference current with a sensing voltage VPB received from the page buffer group 2232 to output the pass signal PASS or the fail signal FAIL.

The memory cell array 2240 may include a plurality of memory blocks BLK1 to BLKi in which data is stored. The memory blocks BLK1 to BLKi may store user data and various pieces of information necessary for the operation of the memory device 2200. The memory blocks BLK1 to BLKi may be implemented in a two-dimensional structure or a three-dimensional structure, and may be configured identically to each other.

Figure 15:
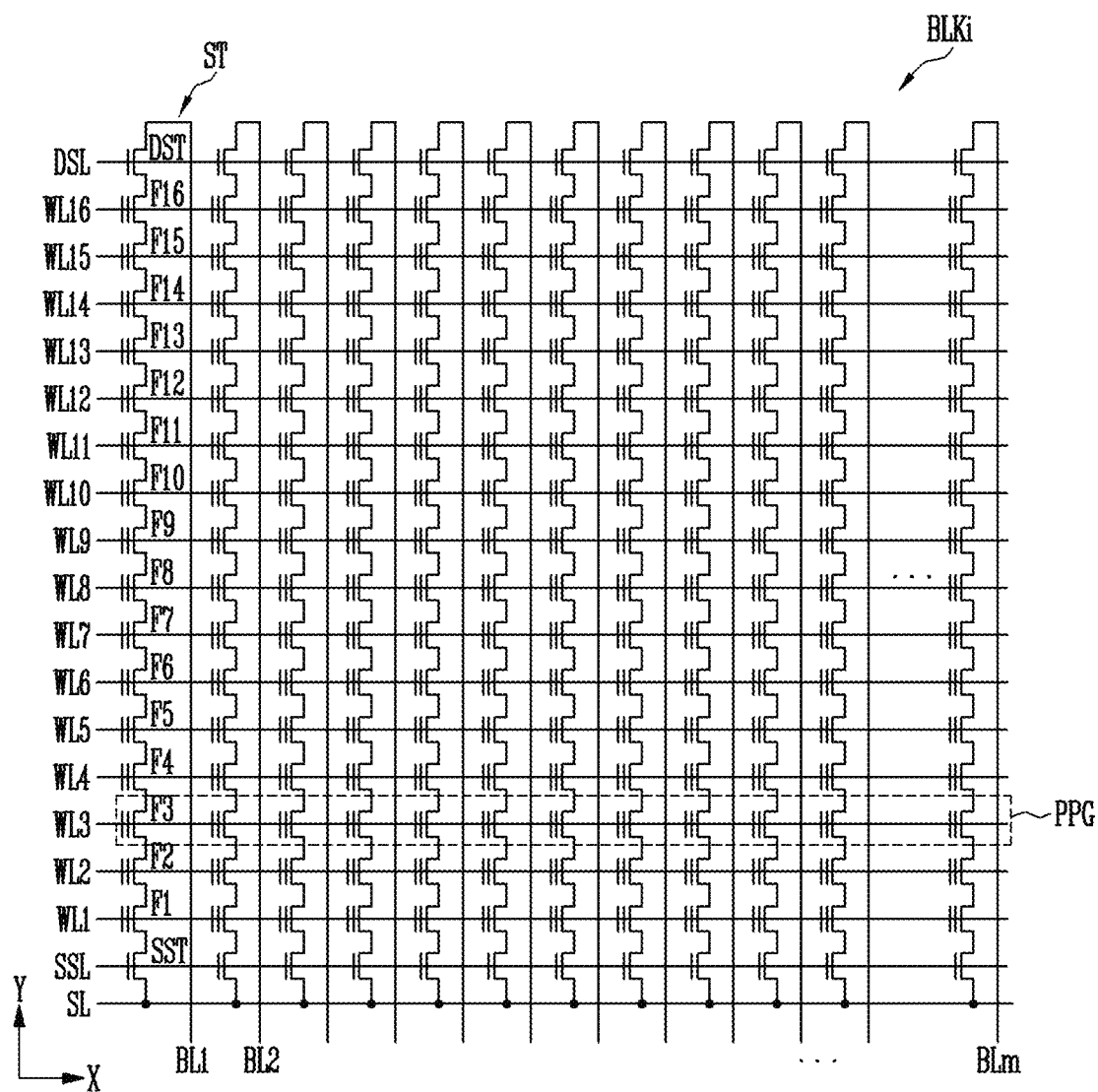
FIG. 15 is an exemplary diagram for describing a memory block.

FIG. 15 is an exemplary diagram for describing a memory block.

The memory cell array may include a plurality of memory blocks, and FIG. 15 shows one memory block BLKi among the plurality of memory blocks for convenience of description.

A plurality of word lines arranged in parallel to each other between a first select line and a second select line may be connected to the memory block BLKi. Here, the first select line may be a source select line SSL, and the second select line may be a drain select line DSL. Specifically, the memory block BLKi may include a plurality of strings ST connected between the bit lines BL1 to BLm and a source line SL. The bit lines BL1 to BLm may be connected to the strings ST, respectively, and the source line SL may be commonly connected to the strings ST. Since the strings ST may be configured identically to each other, the string ST connected to the first bit line BL1 will be specifically described as an example.

The string ST may include a source select transistor SST, a plurality of memory cells F1 to F16, and a drain select transistor DST connected in series between the source line SL and the first bit line BL1. One string ST may include at least one source select transistor SST and at least one drain select transistor DST, and may include memory cells of the number greater than the number of memory cells F1 to F16 shown in the drawing.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of the source select transistors SST included in different strings ST may be connected to the source select line SSL, gates of the drain select transistors DST may be connected to the drain select line DSL, and gates of the memory cells F1 to F16 may be connected to a plurality of word lines WL1 to WL16. A group of memory cells connected to the same word line among memory cells included in different strings ST may be referred to as a physical page PPG. Therefore, the memory block BLKi may include as many physical pages PPG as the number of word lines WL1 to WL16.

Figure 16:
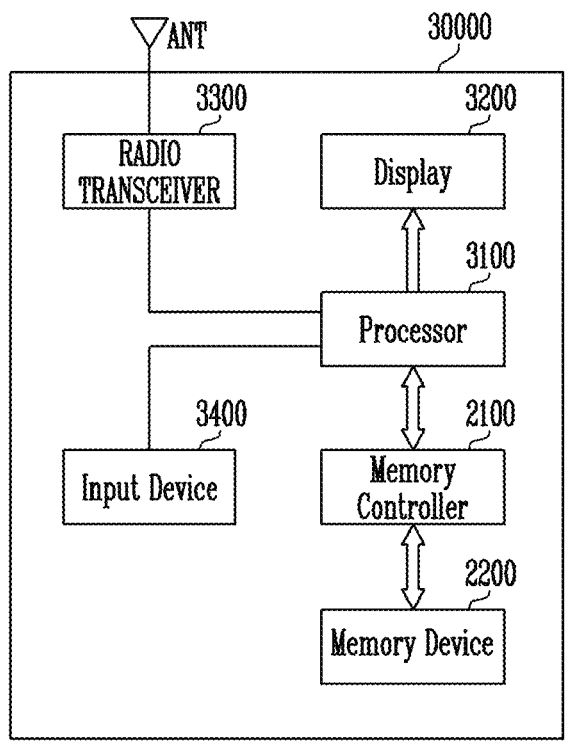
FIG. 16 is a diagram for describing another example of the memory system including a memory controller shown in FIG. 13.

FIG. 16 is a diagram for describing another example of the memory system including the memory controller shown in FIG. 13.

Referring to FIG. 16, the memory system 30000 may be implemented as a cellular phone, a smart phone, a tablet, a personal computer (PC), a personal digital assistant (PDA), or a wireless communication device. The memory system 30000 may include the memory device 2200 and the memory controller 2100 capable of controlling the operation of the memory device 2200.

The memory controller 2100 may control a data access operation, for example, a program operation, an erase operation, a read operation, or the like, of the memory device 2200 under control of a processor 3100.

Data programmed in the memory device 2200 may be output through a display 3200 under the control of the memory controller 2100.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 2100 or the display 3200. The memory controller 2100 may transmit the signal processed by the processor 3100 to the memory device 2200. In addition, the radio transceiver 3300 may convert a signal output from the processor 3100 into a radio signal, and output the converted radio signal to an external device through the antenna ANT.

An input device 3400 may be a device capable of inputting a control signal for controlling the operation of the processor 3100 or data to be processed by the processor 3100. The input device 3400 may be implemented as a pointing device such as a touch pad or a computer mouse, a keypad, a keyboard, or an image sensor.

The processor 3100 may control an operation of the display 3200 so that data output from the memory controller 2100, data output from the radio transceiver 3300, or data output from the input device 3400 is output through the display 3200.

According to an embodiment, the memory controller 2100 capable of controlling the operation of memory device 2200 may be implemented as a part of the processor 3100 and may be implemented as a chip separate from the processor 3100.

Figure 17:
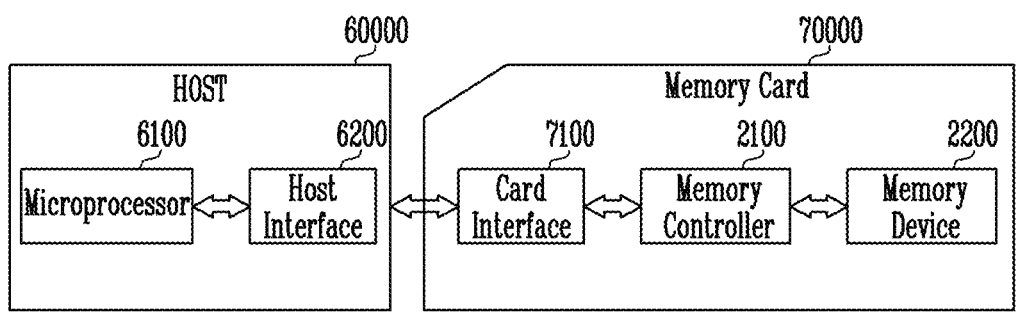
FIG. 17 is a diagram for describing another example of the memory system including the memory controller shown in FIG. 13.

FIG. 17 is a diagram for describing another example of the memory system including the memory controller shown in FIG. 13.

Referring to FIG. 17, the memory system 70000 may be implemented as a memory card or a smart card. The memory system 70000 may include the memory device 2200, the memory controller 2100, and a card interface 7100.

The memory controller 2100 may control data exchange between the memory device 2200 and the card interface 7100. According to an embodiment, the card interface 7100 may be a secure digital (SD) card interface or a multi-media card (MMC) interface, but is not limited thereto.

The card interface 7100 may interface data exchange between a host 60000 and the memory controller 2100 according to a protocol of the host 60000. According to an embodiment, the card interface 7100 may support a universal serial bus (USB) protocol, and an interchip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet, a digital camera, a digital audio player, a mobile phone, a console video game hardware, or a digital set-top box, the host interface 6200 may perform data communication with the memory device 2200 through the card interface 7100 and the memory controller 2100 under control of a microprocessor 6100.

What is claimed is:

1. An electronic device comprising:
    a decoding controller configured to input a primary syndrome vector generated based on a read vector and a parity check matrix to a trained artificial neural network, and to select one of a first error correction decoding algorithm and a second error correction decoding algorithm based on an output of the trained artificial neural network corresponding to the input; and
    an error correction decoder configured to perform an error correction decoding on the read vector using the selected error correction decoding algorithm,
    wherein the output of the trained artificial neural network includes a first predicted value indicating a probability that a first error correction decoding using the first error correction decoding algorithm is successful.

2. The electronic device of claim 1, wherein the first error correction decoding algorithm is a bit-flipping algorithm, and
    the second error correction decoding algorithm is a min-sum algorithm or a sum-product algorithm.

3. The electronic device of claim 1, wherein the first predicted value is a probability value to which logistic regression is applied.

4. The electronic device of claim 1, wherein the decoding controller is configured to select the first error correction decoding algorithm in a case that the first predicted value is equal to or greater than a first reference value, and select the second error correction decoding algorithm in a case that the first predicted value is less than the first reference value.

5. The electronic device of claim 4, wherein the output of the trained artificial neural network further includes a second predicted value indicating a probability that the first error correction decoding is failed, and
    the first reference value is the second predicted value.

6. The electronic device of claim 4, wherein the decoding controller is further configured to select a power mode to be applied to the selected error correction decoding algorithm between a low power mode and a high power mode based on the output of the trained artificial neural network, and
    the error correction decoder is configured to perform the error correction decoding by applying the selected power mode to the selected error correction decoding algorithm.

7. The electronic device of claim 6, wherein the decoding controller is configured to select the high power mode when the first predicted value is equal to or greater than the first reference value and less than a second reference value that is greater than the first reference value, and select the low power mode when the first predicted value is equal to or greater than the second reference value.

8. The electronic device of claim 6, wherein the decoding controller is configured to select the high power mode during which an unreliability value of each of variable nodes is used.

9. The electronic device of claim 6, wherein the decoding controller is configured to select the high power mode having a higher bit precision compared to the low power mode.

10. The electronic device of claim 4, wherein the error correction decoder is configured to perform a second error correction decoding using the second error correction decoding algorithm in a case that the first error correction decoding using the selected first error correction decoding algorithm is failed.

11. The electronic device of claim 4, further comprising:
    a training component configured to retrain the trained artificial neural network by performing hard labeling that the primary syndrome vector is a fail class when the first error correction decoding using the selected first error correction decoding algorithm is failed.

12. The electronic device of claim 11, wherein the training component retrains the trained artificial neural network in a case that the first predicted value is equal to or greater than a third reference value that is greater than the first reference value.

13. The electronic device of claim 4, further comprising:
    a training component configured to retrain the trained artificial neural network by performing soft labeling that the primary syndrome vector is a success class in a case that a second error correction decoding using the selected second error correction decoding algorithm is successful.

14. The electronic device of claim 13, wherein the training component is configured to retrain the trained artificial neural network in a case that an iteration number (i) of an i-th iteration in which the second error correction decoding is successful is equal to or less than a fourth reference value.

15. The electronic device of claim 14, wherein the training component is configured to perform the soft labeling with a higher value as the iteration number (i) of the i-th iteration where the second error correction decoding is successful is lower.

16. The electronic device of claim 13, wherein the training component is configured to retrain the trained artificial neural network when the number of error bits corrected as a result of the second error correction decoding is equal to or less than a fifth reference value.

17. The electronic device of claim 16, wherein the training component is configured to perform the soft labeling with a higher value as the number of corrected error bits is smaller.

18. A method of operating an electronic device, the method comprising:
generating a primary syndrome vector based on a read vector and a parity check matrix;
inputting the generated primary syndrome vector to a trained artificial neural network;
selecting an error correction decoding algorithm that is either a first error correction decoding algorithm or a second error correction decoding algorithm based on an output of the trained artificial neural network; and
performing an error correction decoding on the read vector using the selected error correction decoding algorithm,
wherein the output of the trained artificial neural network includes a first predicted value indicating a probability that a first error correction decoding using the first error correction decoding algorithm is successful.

19. The method of claim 18, wherein the selecting of the error correction decoding algorithm comprises selecting the first error correction decoding algorithm in a case that the first predicted value is equal to or greater than a first reference value, and selecting the second error correction decoding algorithm in a case that the first predicted value is less than the first reference value.

20. The method of claim 19, further comprising:
selecting a power mode to be applied to the selected error correction decoding algorithm between a low power mode and a high power mode based on the output of the trained artificial neural network,
wherein the performing of the error correction decoding is performed by applying the selected power mode to the selected error correction decoding algorithm.

* * * * *